(12) United States Patent
Boettcher et al.

(10) Patent No.: US 10,729,043 B1
(45) Date of Patent: Jul. 28, 2020

(54) VACUUM CAP SEAL INSTALLATION

(71) Applicant: THE BOEING COMPANY, Chicago, IL (US)

(72) Inventors: Philipp A. Boettcher, Philadelphia, PA (US); Derek R. Tuck, Charleston, SC (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/386,994

(22) Filed: Apr. 17, 2019

(51) Int. Cl.
| H05K 9/00 | (2006.01) |
| F16K 13/00 | (2006.01) |
| F16B 37/14 | (2006.01) |

(52) U.S. Cl.
CPC .......... *H05K 9/0015* (2013.01); *F16B 37/14* (2013.01); *F16K 13/00* (2013.01)

(58) Field of Classification Search
CPC .......................... H05K 9/0041; H05K 9/0015
See application file for complete search history.

(56) References Cited

U.S. PATENT DOCUMENTS

| 4,883,399 | A | * | 11/1989 | MacLean | .............. | F16B 33/006 |
| | | | | | | 411/431 |
| 6,053,683 | A | * | 4/2000 | Cabiran | .................. | F16B 37/14 |
| | | | | | | 411/372.6 |
| 6,877,997 | B2 | * | 4/2005 | Schaty | ................... | H01R 4/307 |
| | | | | | | 439/92 |
| 2005/0130336 | A1 | * | 6/2005 | Collins, III | ............ | H01L 33/52 |
| | | | | | | 438/26 |
| 2012/0320552 | A1 | * | 12/2012 | Strong | .................... | F16B 37/14 |
| | | | | | | 361/807 |
| 2013/0116632 | A1 | * | 5/2013 | Yavorsky | ............ | A61M 5/1413 |
| | | | | | | 604/257 |
| 2013/0175084 | A1 | * | 7/2013 | Taylor | .................... | H05K 5/061 |
| | | | | | | 174/563 |

* cited by examiner

*Primary Examiner* — Hung V Ngo
(74) *Attorney, Agent, or Firm* — Marshall, Gerstein & Borun LLP

(57) ABSTRACT

An electromagnetic effect protective cap assembly for enclosing an end portion of a fastener assembly extending through a structure, includes a sidewall configured to define an interior space and having an end portion of the sidewall which defines a first opening aligned with the interior space which allows passage of the end portion of the fastener assembly through the first opening and into the interior space. The protective cap further includes a second opening which is defined by and extends through the sidewall and is spaced apart from the first opening. In addition, the protective cap further includes a valve member positioned in blocking relationship with respect to the second opening with the valve member positioned between the interior space and an exterior of the sidewall.

20 Claims, 8 Drawing Sheets

VACUUM CAP SEAL INSTALLATION

FIELD

This disclosure relates to an electromagnetic effect ("EME") protective cap for enclosing an end portion of a fastener assembly, which extends through a structure, to contain any ignition mechanisms produced by energy dissipated at the fastener assembly and structure interface and more particularly to an EME protective cap which secures to the structure with an adhesive sealant.

BACKGROUND

EME protective caps are used within an aircraft construction to mitigate electromagnetic effects, from lightning strikes. The protective caps are used particularly in areas of the aircraft such as within fuel tanks and other areas within the aircraft which may contain sensitive equipment and/or flammable material. The protective caps are secured to a structure of the aircraft with an adhesive sealant wherein the protective caps enclose an end portion of a fastener assembly extending from the structure.

During the lifetime of an aircraft the protective caps are removed from the structure of the aircraft to which they are secured to inspect the substructure and integrity of the fastener assembly, which would include for example the threaded fastener and any collars, nuts, washers and any other related securement components. When maintenance is complete, protective caps need to be installed at the locations where the protective caps were removed. Installation of the protective caps, whether at the time of completion of maintenance or at the time of original fabrication of the aircraft, involve the installer holding the protective cap in position against the structure enclosing the end portion of the fastener assembly while the adhesive sealant adequately cures thereby securing the protective cap to the structure.

The installer holding the protective cap in position while the adhesive sealant adequately cures is time consuming and costly. This is particularly the case when the protective cap is positioned upside down, on an incline or on a vertical surface of a structure and needs to be held in that position by the installer and resist the force applied to the protective cap by gravity. The protective cap needs to be held in position for a sufficient amount of time for the sealant to adequately cure and avoid separation of the protective cap from the structure or sliding of the protective cap relative to the structure. As a result, there is a need to efficiently and cost effectively hold the protective cap in position against the structure during cure of the adhesive sealant in the interface between the protective cap and the structure and not involve excessive time of the installer to hold the protective cap in position waiting for the adhesive sealant to cure.

SUMMARY

An example includes an electromagnetic effect protective cap assembly for enclosing an end portion of a fastener assembly extending through a structure, which includes a sidewall configured to define an interior space and having an end portion of the sidewall which defines a first opening aligned with the interior space, which allows passage of the end portion of the metallic fastener through the first opening and into the interior space. The protective cap further includes a second opening which is defined by and extends through the sidewall and is spaced apart from the first opening. In addition, the protective cap further includes a valve member positioned in blocking relationship with respect to the second opening with the valve member positioned between the interior space and an exterior of the sidewall.

Another example includes a method for installing an electromagnetic protective cap assembly to enclose an end portion of a fastener assembly extending from a structure, which includes positioning the electromagnetic protective cap over the end portion of the fastener assembly and onto the structure from which the fastener assembly extends. The protective cap assembly includes a sidewall configured to define an interior space and having an end portion of the sidewall which defines a first opening aligned with the interior space and which allows passage of the end portion of the fastener assembly through the first opening and into the interior space. The protective cap further includes a second opening which is defined by and extends through the sidewall and is spaced apart from the first opening. In addition, the protective cap includes a valve member positioned in blocking relationship with respect to the second opening with the valve member positioned between the interior space and an exterior of the sidewall. The method further includes reducing air pressure within the interior space through the valve member.

The features, functions, and advantages that have been discussed can be achieved independently in various embodiments or may be combined in yet other embodiments further details of which can be seen with reference to the following description and drawings.

DESCRIPTION

Figure 1:
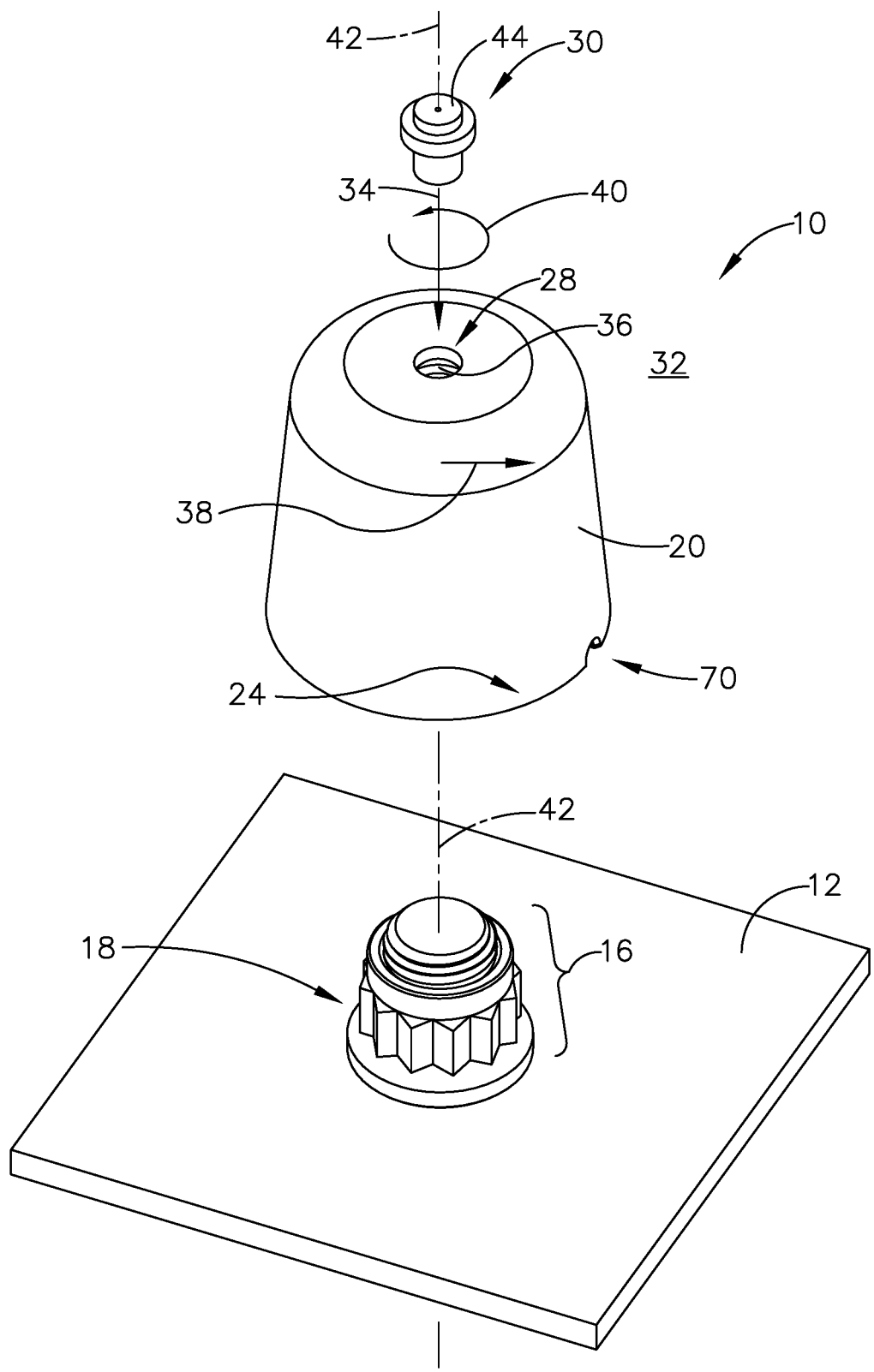
FIG. 1 is an exploded view of a first example of a protective cap assembly positioned aligned with a fastener assembly to be secured to a structure.

In referring to FIGS. 1-4, a first example of EME protective cap assembly 10, herein after referred to as protective cap assembly 10, is shown and in referring to FIGS. 5 and 6, a second example of EME protective cap assembly 10', herein after referred to as protective cap assembly 10', is shown. Protective cap assemblies 10 and 10' are used within an aircraft construction to mitigate electromagnetic effects, from lightning strikes. Protective cap assembly 10 and 10' are used particularly in areas of the aircraft such as within fuel tanks and other areas within the aircraft which may contain sensitive equipment and/or flammable material. Protective cap assembly 10, as seen in FIG. 3, and protective cap assembly 10', as seen in FIG. 6, are secured to structure 12 of the aircraft with an adhesive sealant 14, wherein the first example of protective cap assembly 10 and the second example of protective cap assembly 10' enclose an end portion 16 of fastener assembly 18 which extends through structure 12. End portion 16 of fastener assembly 18 which extends through structure 12 and is enclosed by protective cap assembly 10, 10' can include either end portion of the fastener assembly such as a head end of the fastener assembly which may include other fastener assembly components or the threaded fastener end of the fastener assembly which may include other fastener assembly securement components. Fastener assembly (18) can be constructed from one of a variety of materials such as metal, fiberglass and other materials commonly utilized in the construction of fastener assemblies.

As earlier mentioned, time and costs are consumed with an installer needing to hold a protective cap assembly in position while adhesive sealant 14 cures so as to avoid unwanted separation of the protective cap assembly from structure 12 prior to adhesive sealant 14 curing. As will be discussed herein, first example of protective cap assembly 10, as seen in FIGS. 1-4, and second example of protective cap assembly 10', as seen in FIGS. 5 and 6, will not overly burden the installer to hold the first and second example of protective cap assembly 10 and 10' in position while adhesive sealant 14 adequately cures, even in instances where the protective cap assembly 10 and 10' is positioned upside down.

First example of protective cap assembly 10, as seen in FIGS. 1-4, for enclosing an end portion 16 of fastener assembly 18 extending through structure 12 includes sidewall 20 configured to define interior space 22. Sidewall 20 has end portion 24 which defines first opening 26 aligned with interior space 22. First opening 26 allows passage of end portion 16 of fastener assembly 18 through first opening 26 and into interior space 22. Second opening 28 is defined by and extends through sidewall 20 and is spaced apart from first opening 26. Valve member 30 is positioned in blocking relationship with respect to second opening 28 with valve member 30 positioned between interior space 22 and exterior 32 of sidewall 20.

Figure 2:
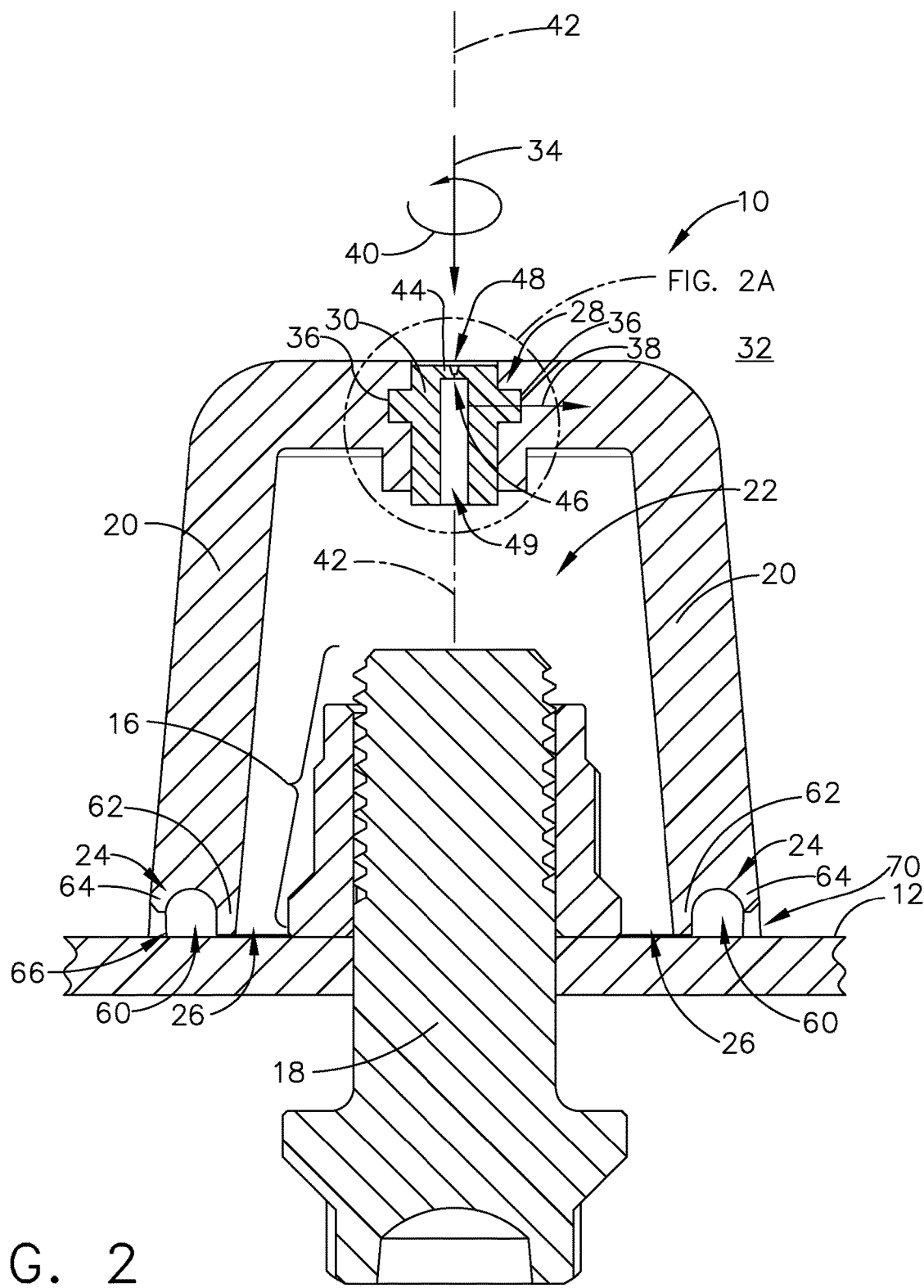
FIG. 2 is a cross section view of the first example of the protective cap assembly along line 2-2 in FIG. 1 with the protective cap assembly positioned on the structure with an end portion of the fastener assembly positioned within an interior space of the protective cap assembly.

Second opening 28 extends through sidewall 20 in first direction 34, as seen in FIGS. 1 and 2, from exterior 32 of sidewall 20 through to interior space 22 of sidewall 20. Sidewall 20 defines valve securement channel 36 which extends in second direction 38 from second opening 28 transverse to first direction 34 and valve securement channel 36 extends in third direction 40 about first direction 34. Valve securement channel 36, as will be further discussed, will ensure valve member 30 remains positioned within second opening 28 with experiencing, for example, differential air pressures between interior space 22 and exterior 32 of sidewall 20. In this example, first direction 34 includes central axis 42 of sidewall 20. Valve member 30 includes wall portion 44, which defines valve opening 46, which extends through wall portion 44 and is positioned in a collapsed sealed closed position, as seen in FIG. 2A.

Figure 2A:
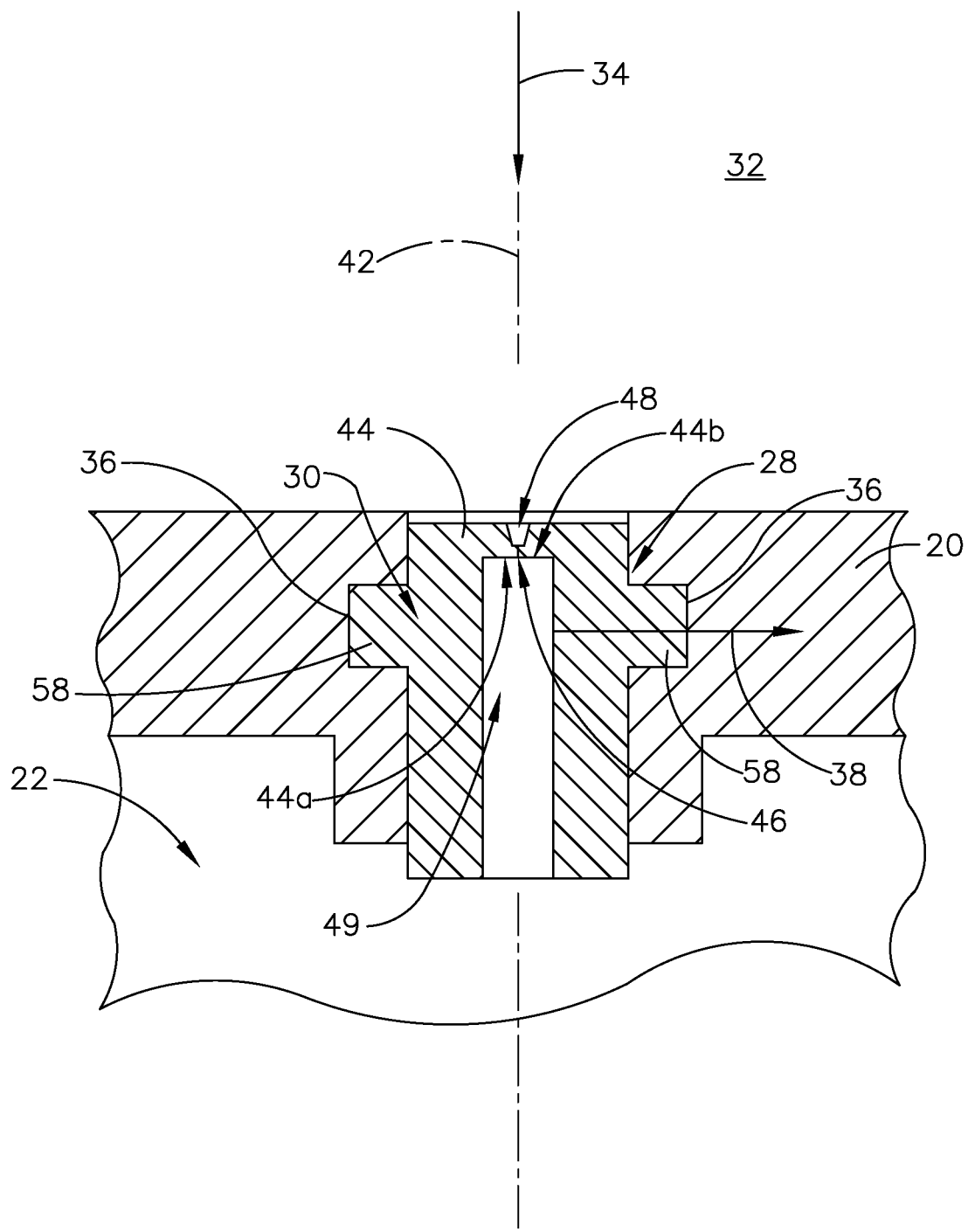
FIG. 2A is an enlarged view of that which is encircled and identified as 2A in FIG. 2.
Figure 3:
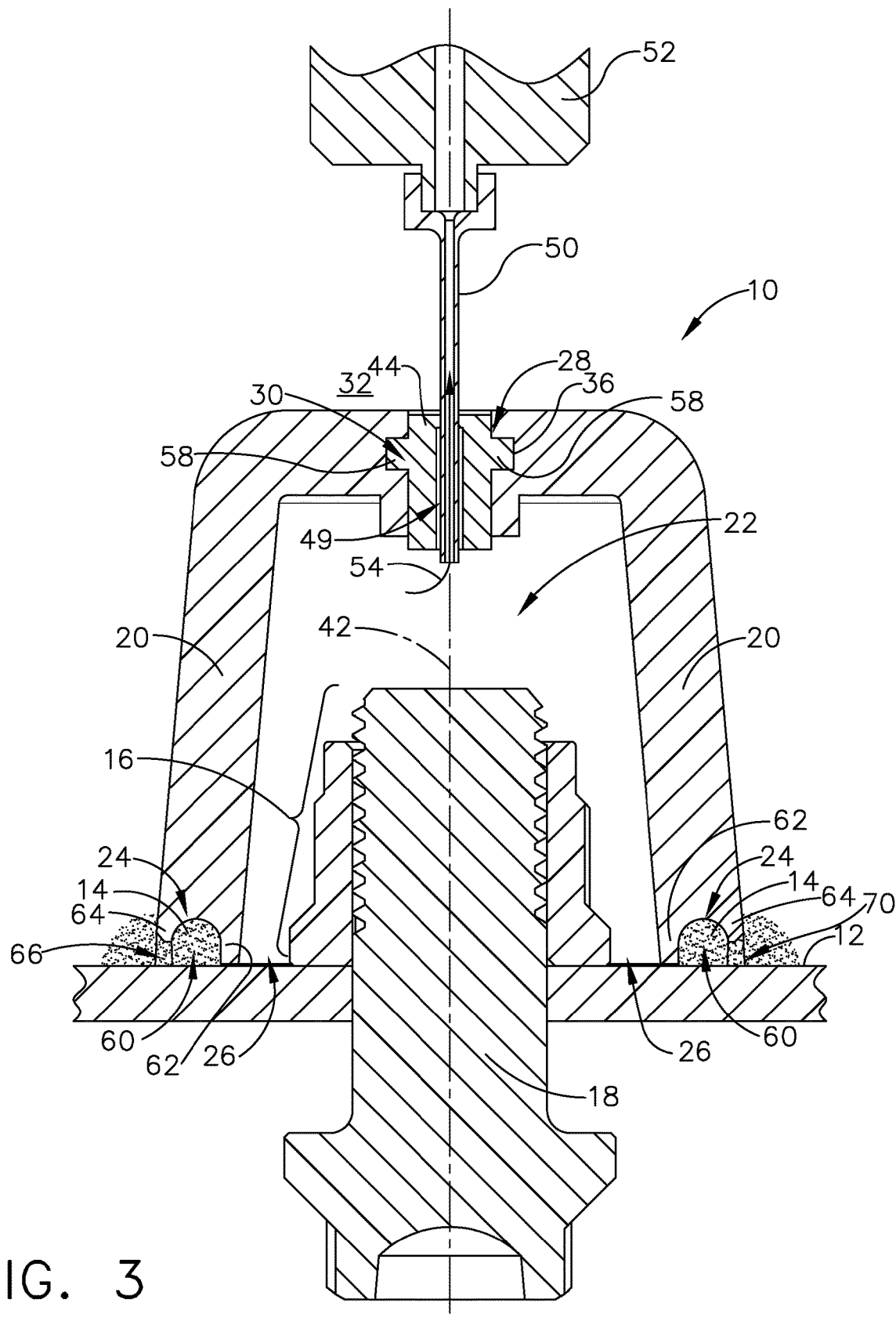
FIG. 3 is the view of the protective cap assembly of FIG. 2 wherein a reduced pressure has been drawn from an interior of the protective cap assembly with a vacuum pump assembly accessing the interior space of the protective cap assembly and with an adhesive sealant positioned between the protective cap assembly and the structure.

In referring to FIG. 2A, wall portion 44, in this example, extends across second opening 28 and defines recess 48 centrally positioned in wall portion 44 in alignment with second opening 28. Recess 48 extends through a portion of wall portion 44 in first direction 34 extending toward interior space 22. Valve opening 46 extends from recess 48 from exterior 32 of sidewall 20 in first direction 34 with valve opening 46 in the collapsed sealed closed position extending from recess 48 to valve channel 49 defined by valve member 30. Valve channel 49 extends from wall portion 44 to interior space 22. Valve member 30 is constructed of a resilient material such as rubber or other like resilient material. Gas needle 50 of vacuum pump assembly 52, as seen in FIG. 3, can be pushed into recess 48, aligning gas needle 50 with valve channel 49. Gas needle 50 can then continue to be pushed against portions 44a and 44b abutting against one another of wall portion 44 which define valve opening 46. Gas needle 50 inserts into valve opening 46 with portions 44a and 44b of wall portion 44 separating allowing gas needle 50 to pass through wall portion 44 and enter into valve channel 49 with portions 44a and 44b of wall portion 44 pushing against gas needle 50. Portions 44a and 44b push against gas needle 50 maintaining a seal between wall portion 44 and gas needle 50 sealing interior space 22 from exterior 32 of sidewall 20 with gas needle 50, in this example, being further pushed entering into interior space 22. With valve opening 46 positioned in an open position with gas needle 50, as seen in FIG. 3, occupying space between portions 44a and 44b of wall portion 44, flow path 54 is defined from interior space 22 through valve channel 49, through valve opening 46 and to the exterior 32 of sidewall 20. In this example, flow path 54 extends through gas needle 50 to evacuate air within interior space 22 to vacuum pump assembly 52 being in exterior 32 of sidewall 20 and thereby reducing air pressure within interior space 22.

Valve member 30 positioned within second opening 28 defines projection 58, which extends about valve member 30 such that projection 58 extends positioned within valve securement channel 36 defined in sidewall 20, as seen in FIG. 2A, and extends in second direction 38 transverse to first direction 34 and in a third direction 40 about first direction 34. With projection 58 positioned within valve securement channel 36, valve member 30 is secured within sidewall 20 such that projection 58 resists movement being imparted to valve member 30 with the insertion of and removal of gas needle 50 as well as maintaining valve member 30 in position within second opening 28 with valve member 30 experiencing a differential in air pressure between interior space 22 and exterior 32 of sidewall 20. As will be discussed below with gas needle 50 within interior space 22, vacuum pump assembly 52 in fluid communication with gas needle 50, when activated will reduce air pressure within interior space 22 below the air pressure in exterior 32 of sidewall 20.

With protection cap assembly 10 positioned against structure 12 and gas needle 50 positioned through wall portion 44 of valve member 30, vacuum pump assembly 52 is activated. Activation of vacuum pump assembly 52 results in air being removed from interior space 22 of sidewall 20 of protection cap assembly 10. With reduced air pressure positioned in interior space 22, the relatively higher pressure, such as in this example, atmospheric pressure, positioned in exterior 32 of sidewall 20 applies a force onto sidewall 20 securing protection cap assembly 10 against structure 12. With removal of gas needle 50 from protective cap assembly 10, portions 44a and 44b of wall portion 44 collapse together abutting one another sealing closed valve opening 46 maintaining air pressure differential between interior space 22 and exterior 32 of sidewall 20. In some examples, a dab (not shown) of adhesive sealant 14 can be positioned on top of valve opening 46 further securing the reduced air pressure within interior space 22. In this example, with protection cap assembly 10 secured against structure 12, adhesive sealant 14 can be injected into channel 60.

Figure 4:
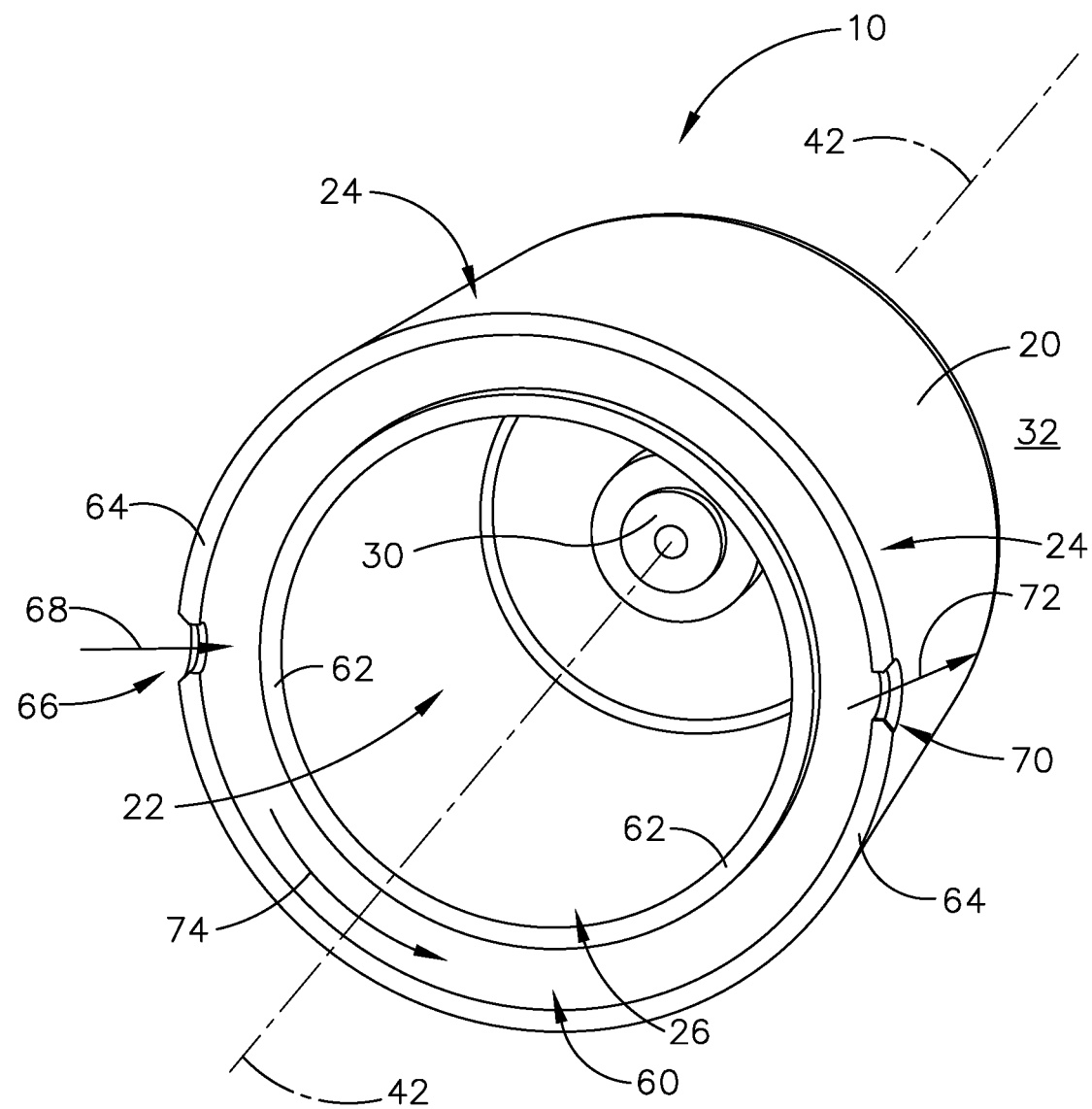
FIG. 4 is a bottom perspective view of the protective cap assembly of FIG. 1.

End portion 24 of sidewall 20 defines channel 60 having inner wall portion 62 of end portion 24 of sidewall 20 and outer wall portion 64 of end portion 24 of sidewall 20, as seen in FIG. 4. Outer wall portion 64 of end portion 24 of sidewall 20 defines first port 66, which extends through outer wall portion 64 of end portion 24 of sidewall 20 defining first flow path 68 between exterior 32 of sidewall 20 and channel 60. Outer wall portion 64 of end portion 24 of sidewall 20 defines second port 70, which extends through outer wall portion 64 of end portion 24 of sidewall 20 defining second flow path 72 between channel 60 and exterior 32 of sidewall 20, as seen in FIG. 4.

Channel 60 extends in direction 74 about central axis 42 of sidewall 20 as seen in FIG. 4. First port 66 and second port 70 are positioned spaced apart from one another. First port 66 and second port 70 are positioned on opposing sides of sidewall 20, as seen in FIG. 4. With sidewall 20 of protection cap assembly 10 secured to structure 12 with the reduction of air pressure within interior space 22, installer can insert adhesive sealant 14, for example, into first port 66 and adhesive sealant 14 can travel along channel 60 such that adhesive sealant 14 exits second port 70. With exiting of adhesive sealant 14 out of second port 70 installer is assured sufficient amount adhesive sealant 14 has been positioned within channel 60 for securing sidewall 20 of protective cap assembly 10 to structure 12. Excess adhesive sealant 14 exiting first port 66 and exiting second port 70 can be wiped off of structure 12 prior to adhesive sealant 14 curing. With sidewall 20 secured to structure 12 with a differential of air pressure, as described above, between exterior 32 of sidewall 20 and interior space 22, protective cap assembly 10 is held in position enclosing end portion 16 of fastener assembly 18, which extends from structure 12 while adhesive sealant 14 cures. Cure time can vary depending on the adhesive sealant 14 being used and environmental conditions such as temperature and humidity. The pressure differential between exterior 32 of sidewall 20 and interior space 22 maintains sidewall 20 of protective cap assembly 10 in position preventing protective cap assembly from separating or sliding, as discussed earlier, relative to structure 12 during the cure of adhesive sealant 14.

The installer can also sequence the installation of protective cap assembly 10 with holding protective cap assembly 10 against structure 12 enclosing end portion 16 of fastener assembly 18 and then inject adhesive sealant 14 into channel 60. With adhesive sealant 14 positioned within channel 60, the installer thereafter can insert gas needle 50 through valve member 30 into interior space 22 of protective cap assembly 10 and reduce the air pressure within interior space 22, which results in holding protective cap assembly 10 in position while adhesive sealant 14 cures. The dab (not shown) of adhesive sealant 14 can be then placed over valve opening 46 as elected by the installer.

Figure 5:
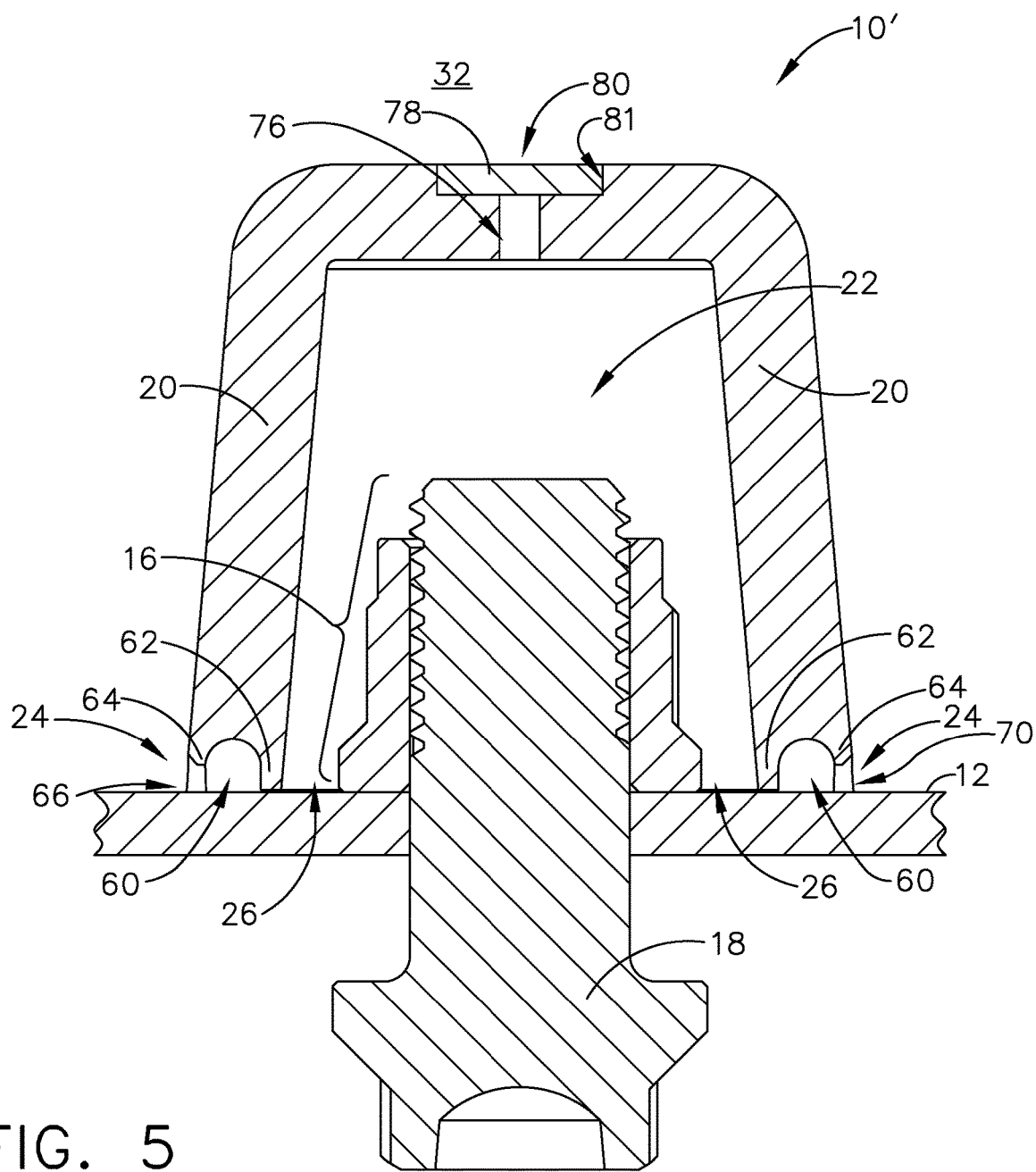
FIG. 5 is a cross section view of a second example of the protective cap assembly, as similarly shown for first example of the first example of FIG. 2, with an end portion of the fastener assembly positioned within an interior space within the protective cap assembly.
Figure 6:
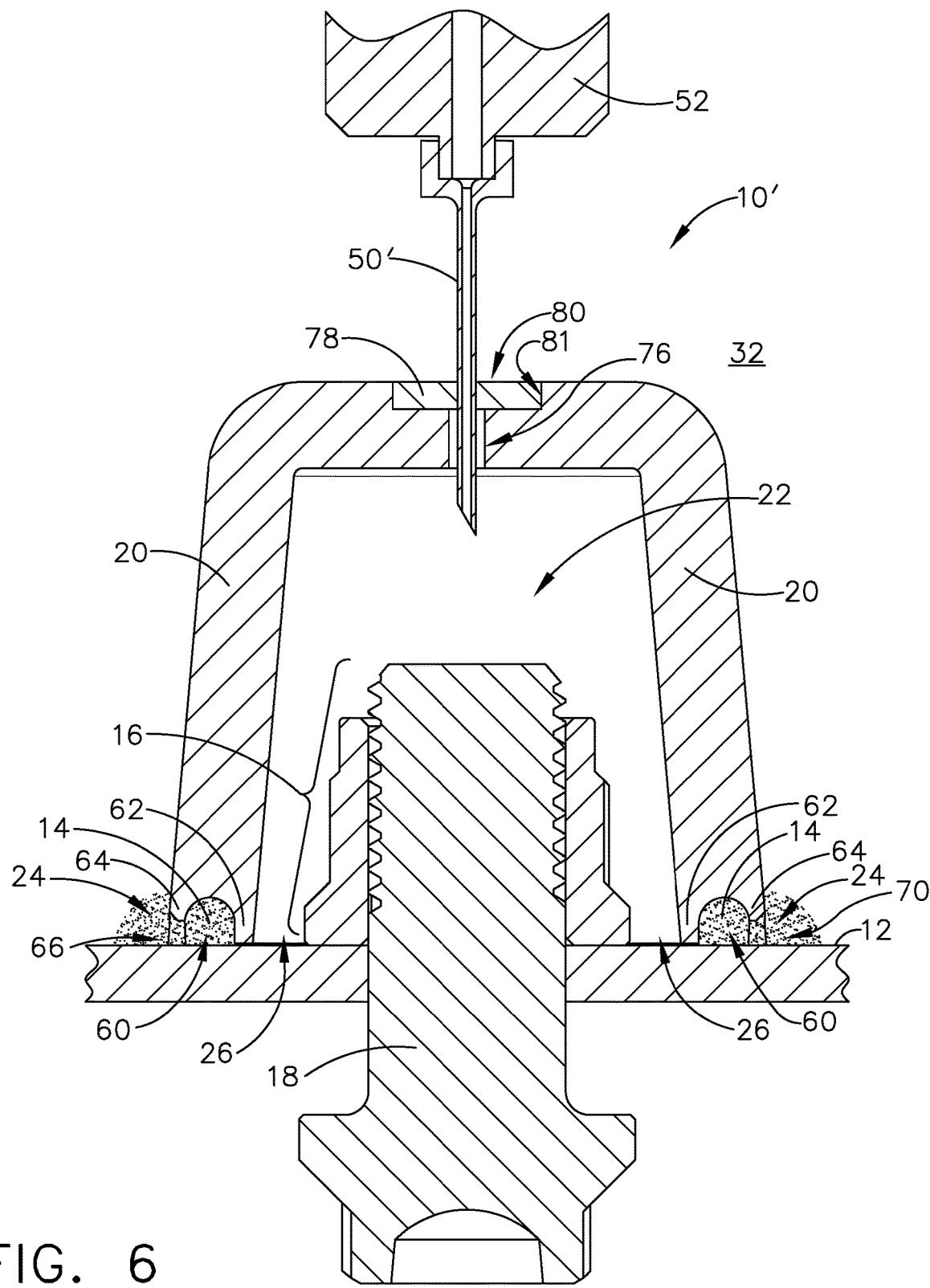
FIG. 6 is a cross section view of the second example of the protective cap assembly of FIG. 5, wherein a reduced pressure has been drawn in an interior of the protective cap assembly by a vacuum pump assembly and with an adhesive sealant positioned between the protective cap assembly and the structure.

Second example of protective cap assembly 10', as seen in FIGS. 5-6, for enclosing an end portion 16 of fastener assembly 18 extending through structure 12 includes sidewall 20 configured to define interior space 22. Sidewall 20 has end portion 24 which defines first opening 26 aligned with interior space 22. First opening 26 allows passage of end portion 16 of fastener assembly 18 through first opening 26 and into interior space 22. Second opening 76 is defined by and extends through sidewall 20 and is spaced apart from first opening 26. Valve member 78 is positioned in blocking relationship with respect to second opening 76 with valve member 78 positioned between interior space 22 and exterior 32 of sidewall 20.

Valve member 78 in this example includes septum valve 80 secured to sidewall 20. Septum valve 80 in this example is secured with an adhesive in this example within recess 81 formed by sidewall 20 as a portion of second opening 76 defined by the sidewall 20 such that septum valve 80 is positioned overlying second opening 76, which extends from exterior 32 of sidewall 20 to interior space 22 of sidewall 20.

Septum valve 80 includes one of a homogenous resilient material such as for example rubber or a rubber-like resilient material or an assembly having an outer shell (not shown) constructed of a less resilient first material as for example, a material such as polytetrafluoroethylene ("PTFE") which encloses a second material, such as rubber or rubber-like resilient material, which is more resilient than the first material. This seal assembly can be seen for example as a seal assembly referred to as PURESEP-T, a registered trademark of Ohio Valley Specialty Chemical Co. of Marietta, Ohio. In either example, with gas needle 50', which is connected to vacuum pump assembly 52 as seen in FIG. 6, inserted through septum valve 80, the resilient material of rubber or rubber like resilient material permits gas needle 50' to penetrate septum valve 80 and enter into interior space 22. The rubber or rubber-like material maintains a seal about gas needle 50' between the rubber or rubber-like resilient material and gas needle 50' sealing interior space 22 from exterior 32 of sidewall 20. With removal of gas needle 50' from septum valve 80 the rubber or rubber-like resilient material resiliently moves together closing opening made by gas needle 50', which passed through valve member 78 and entered into interior space 22. As result, interior space 22 is sealed from exterior 32 during reduction of air pressure within interior space 22 by the activation of vacuum pump assembly 52. A dab (not shown) of adhesive sealant 14 can be positioned over septum valve 80 to further secure sealing of interior space 22 from exterior 32 with withdrawal of gas needle 50'.

With the reduction of air pressure in interior space 22, protective cap assembly 10' is forced against structure 12 by a greater air pressure positioned in exterior 32 of sidewall 20 than within interior space 22. With sidewall 20 of protection cap assembly 10 secured to structure 12, with the reduction of air pressure within interior space 22, and with end portion 24 of sidewall 20 having the similar construction for that of end portion 24 of sidewall 20, described earlier and shown in FIG. 4, installer can then insert adhesive sealant 14, for example, into first port 66. Adhesive sealant 14 can travel along channel 60 such that with adhesive sealant 14 exiting second port 70 as seen in FIGS. 4 and 6, the installer is assured sufficient amount adhesive sealant 14 has been positioned within channel 60 for securing sidewall 20 of electromagnetic protective cap assembly 10' to structure 12. Excess adhesive sealant 14 exiting first port 66 and exiting second port 70 can be wiped off of structure 12 prior to adhesive sealant 14 curing. With sidewall 20 secured to structure 12, with a differential of air pressure between exterior 32 of sidewall 20 and interior space 22 as described above, protective cap assembly 10 is held in position enclosing end portion 16 of fastener assembly 18 which extends from structure 12 while adhesive sealant 14 cures. Cure time can vary depending on the adhesive sealant 14 being used and environmental conditions such as temperature and humidity. The pressure differential between exterior 32 of sidewall 20 and interior space 22 maintains sidewall 20 of protective cap assembly 10' in position preventing protective cap assembly from separating from structure 12 during the cure of adhesive sealant 14.

The installer can also sequence the installation of protective cap assembly 10' with holding protective cap assembly 10' against structure 12 enclosing end portion 16 of fastener assembly 18 and then inject adhesive sealant 14 into channel 60. With adhesive sealant 14 positioned within channel 60, installer thereafter can insert pressurized gas needle 50' through valve member 78 and into protective cap assembly 10' and reduce the air pressure within interior space 22, which results in holding protective cap assembly 10' in position while adhesive sealant 14 cures. The dab (not shown) of adhesive sealant 14 can be then placed over septum valve 80 as elected by the installer with withdrawal of gas needle 50'.

Figure 7:
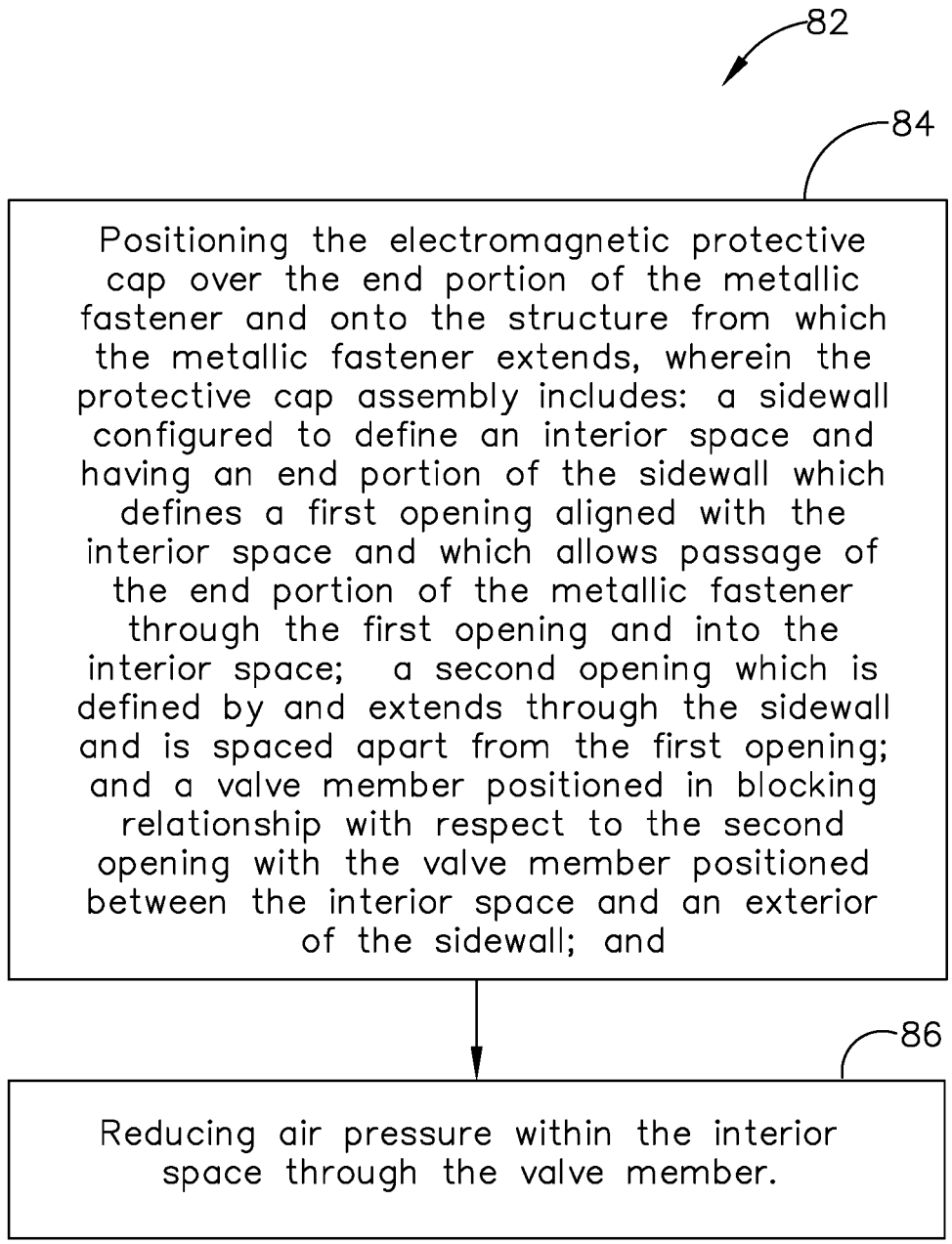
FIG. 7 is a flow chart for the method of installing the protective cap assembly.

In referring to FIG. 7, method 82 for installing either first or second example of electromagnetic protective cap assembly 10, 10' to enclose an end portion 16 of fastener assembly 18 from structure 12 is shown. Method 82 includes step 84 of positioning electromagnetic protective cap assembly 10, 10' over end portion 16 of fastener assembly 18 and onto structure 12 from which fastener assembly 18 extends. As mentioned earlier, the enclosure of end portion 16 can include either end portion of fastener assembly 18 such as a head end of the fastener along with any securement components of the fastener assembly 18 or can include a threaded fastener end portion of the fastener assembly along with any securement components of the fastener assembly. Protective cap assembly 10, 10' includes sidewall 20 configured to define interior space 22 and having end portion 24 of sidewall 20 which defines first opening 26 aligned with interior space 22 and which allows passage of end portion 16 of fastener assembly 18 through first opening 26 and into interior space 22. Protective cap assembly 10, 10' further include second opening 28, with respect to first example of protective cap assembly 10, and second opening 76, with respect to second example of protective cap assembly 10'. Second openings 28, 76 are defined by and extend through sidewall 20 and are spaced apart from first opening 26. Valve member 30, with respect to first example of protective cap assembly 10, and valve member 78, with respect to second example of protective cap assembly 10', are positioned in blocking relationship with respect to second opening 28, with respect to first example of protective cap assembly 10, and second opening 76, with respect to protective cap assembly 10', respectively with valve member 30, 78 positioned between interior space 22 and exterior 32 of sidewall 20. Method 82 further includes step of reducing air pressure (86) within interior space 22 through valve member 30 of first example of protective cap assembly 10 and through valve member 78 of second example of protective cap assembly 10'.

Step of reducing air pressure (86) within interior space 22 includes inserting gas needle 50, of first example of protective cap assembly 10, through valve member 30 and for second example of protective cap assembly 10', inserting gas needle 50' through valve member 78. Method 82 further includes inserting adhesive sealant 14 into channel 60 defined by end portion 24 of sidewall 20 wherein channel 60 has inner wall portion 62 of end portion 24 of sidewall 20 and outer wall portion 64 of end portion 24 of sidewall 20. Inserting adhesive sealant 14 into channel 60 includes inserting adhesive sealant 14 through first port 66 defined by outer wall portion 64 of end portion 24 of sidewall 20. Method 82 further includes curing adhesive sealant 14. With reduction of air pressure within interior space 22, air pressure in exterior 32 of sidewall 20, which is a greater air pressure than that which is positioned within interior space 22, keeps protective cap assembly 10, 10' secured against structure 12 while adhesive sealant 14 cures.

While various embodiments have been described above, this disclosure is not intended to be limited thereto. Variations can be made to the disclosed embodiments that are still within the scope of the appended claims.

What is claimed:

1. An electromagnetic effect protective cap assembly for enclosing an end portion of a fastener assembly extending through a structure, comprising:
   a sidewall configured to define an interior space and having an end portion of the sidewall which defines a first opening aligned with the interior space which allows passage of the end portion of the fastener assembly through the first opening and into the interior space;
   an end portion of the sidewall defines a channel having an inner wall portion of the end portion of the sidewall and an outer wall portion of the end portion of the sidewall;
   the outer wall portion of the end portion of the sidewall defines a first port which extends through the outer wall portion of the end portion of the sidewall defining a first flow path between the channel and the exterior of the sidewall;
   a second opening which is defined by and extends through the sidewall and is spaced apart from the first opening; and
   a valve member positioned in blocking relationship with respect to the second opening with the valve member positioned between the interior space and an exterior of the sidewall.

2. The electromagnetic effect protective cap assembly of claim 1, wherein the outer wall portion of the end portion of the sidewall defines a second port which extends through the outer wall portion of the end portion of the sidewall defining a second flow path between the exterior of the sidewall and the channel.

3. The electromagnetic effect protective cap assembly of claim 2, wherein the channel extends about a central axis of the sidewall.

4. The electromagnetic effect protective cap assembly of claim 3, wherein the first port and second port are positioned spaced apart from one another.

5. The electromagnetic effect protective cap assembly of claim 4 wherein the first port and the second port are positioned on opposing sides of the sidewall.

6. The electromagnetic effect protective cap assembly of claim 1, wherein an adhesive sealant is positioned within the channel.

7. The electromagnetic effect protective cap assembly of claim 1, wherein the valve member comprises a septum valve secured to the sidewall.

8. The electromagnetic effect protective cap assembly of claim 7, wherein:
   the septum valve comprises one of a homogenous resilient material or an assembly having an outer shell constructed of a less resilient first material than a second material positioned within the outer shell; and the septum valve is secured within a recess defined by the sidewall such that the septum valve is positioned overlying the second opening which extends to the interior space of the sidewall.

9. The electromagnetic effect protective cap assembly of claim 1, wherein the second opening extends through the sidewall in a first direction.

10. The electromagnetic effect protective cap assembly of claim 9, wherein the sidewall defines a valve securement channel which extends in a second direction from the second opening transverse to the first direction and the valve securement channel extends in a third direction about the first direction.

11. The electromagnetic effect protective cap assembly of claim 10, wherein the valve member defines a projection which extends about the valve member such that the projection extends positioned within the valve securement channel.

12. An electromagnetic effect protective cap assembly for enclosing an end portion of a fastener assembly extending through a structure, comprising:
   a sidewall configured to define an interior space and having an end portion of the sidewall which defines a first opening aligned with the interior space which allows passage of the end portion of the fastener assembly through the first opening and into the interior space;
   a second opening which is defined by and extends through the sidewall and is spaced apart from the first opening;
   a valve member positioned in blocking relationship with respect to the second opening with the valve member positioned between the interior space and an exterior of the sidewall, wherein:
      the second opening extends through the sidewall in a first direction; and
      the sidewall defines a valve securement channel which extends in a second direction from the second opening transverse to the first direction and the valve securement channel extends in a third direction about the first direction.

13. The electromagnetic effect protective cap assembly of claim 12, wherein the first direction includes a central axis of the sidewall.

14. The electromagnetic effect protective cap assembly of claim 13, wherein the valve member includes a wall portion which defines a valve opening positioned in a collapsed sealed closed position, which extends through the wall portion.

15. The electromagnetic effect protective cap assembly of claim 14, wherein:
   the valve opening positioned in the collapsed sealed closed position extends from the exterior of the sidewall to a valve channel defined by the valve member, which extends to the interior space; and
   with the valve opening positioned in an open position a flow path is defined from the interior space through the valve channel, through the valve opening and to the exterior of the sidewall.

16. The electromagnetic effect protective cap assembly of claim 14, wherein the valve member defines a projection which extends about the valve member such that the projection extends positioned within the valve securement channel defined in the sidewall and extends in the second direction transverse to the first direction.

17. The electromagnetic effect protective cap assembly of claim 12, wherein the sidewall further includes an end portion of the sidewall which defines a channel having an inner wall portion of the end portion of the sidewall and an outer wall portion of the end portion of the sidewall.

18. The electromagnetic effect protective cap assembly of claim 17, wherein:
   the outer wall portion of the end portion of the sidewall defines a first port which extends through the outer wall portion of the end portion of the sidewall defining a first flow path between the channel and the exterior of the sidewall; and
   the outer wall portion of the end portion of the sidewall defines a second port which extends through the outer wall portion of the end portion of the sidewall defining a second flow path between the channel and the exterior of the sidewall.

19. A method for installing an electromagnetic protective cap assembly to enclose an end portion of a fastener assembly extending from a structure, comprising the steps of:
   positioning the electromagnetic protective cap assembly over the end portion of the fastener assembly and onto the structure from which the fastener assembly extends, wherein the electromagnetic protective cap assembly includes:
      a sidewall configured to define an interior space and having an end portion of the sidewall which defines a first opening aligned with the interior space and which allows passage of the end portion of the fastener assembly through the first opening and into the interior space;
      a second opening which is defined by and extends through the sidewall and is spaced apart from the first opening; and
      a valve member positioned in blocking relationship with respect to the second opening with the valve member positioned between the interior space and an exterior of the sidewall;
   reducing air pressure within the interior space with inserting a gas needle through the valve member;
   inserting an adhesive sealant into a channel defined by an end portion of the sidewall, wherein:
      the channel has an inner wall portion of the end portion of the sidewall and an outer wall portion of the end portion of the sidewall; and
      the adhesive sealant is inserted into the channel through a first port defined by the outer wall portion of the end portion of the sidewall.

20. The method for installing an electromagnetic protective cap assembly of claim 19, further including curing the adhesive sealant.

* * * * *